US008731125B2

(12) United States Patent
Zhong

(10) Patent No.: US 8,731,125 B2
(45) Date of Patent: May 20, 2014

(54) METHOD AND APPARATUS FOR ALIGNING PHASES OF A MASTER CLOCK AND A SLAVE CLOCK

(75) Inventor: Shan Zhong, Guangdong Province (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 66 days.

(21) Appl. No.: 13/259,655

(22) PCT Filed: Sep. 2, 2009

(86) PCT No.: PCT/CN2009/073697
§ 371 (c)(1), (2), (4) Date: Dec. 2, 2011

(87) PCT Pub. No.: WO2010/145093
PCT Pub. Date: Dec. 23, 2010

(65) Prior Publication Data

US 2012/0074994 A1 Mar. 29, 2012

(30) Foreign Application Priority Data

Jun. 19, 2009 (CN) .......................... 2009 1 0108248

(51) Int. Cl.
*H04L 23/00* (2006.01)

(52) U.S. Cl.
USPC ............................ 375/373; 370/253; 327/153

(58) Field of Classification Search
USPC ............ 375/373, 356, 371; 370/503; 327/153
See application file for complete search history.

(56) References Cited

U.S. PATENT DOCUMENTS

| | | | | |
|---|---|---|---|---|
| 4,868,514 | A * | 9/1989 | Azevedo et al. | 327/159 |
| 5,638,410 | A * | 6/1997 | Kuddes | 375/357 |
| 6,194,969 | B1 * | 2/2001 | Doblar | 331/2 |
| 6,518,811 | B1 * | 2/2003 | Klecka, III | 327/276 |
| 6,549,046 | B1 * | 4/2003 | Klecka, III | 327/153 |
| 7,372,875 | B2 * | 5/2008 | Hadzic et al. | 370/516 |
| 7,668,276 | B2 * | 2/2010 | Hampel et al. | 375/371 |
| 8,320,409 | B2 * | 11/2012 | Boduch et al. | 370/503 |

(Continued)

FOREIGN PATENT DOCUMENTS

| | | | |
|---|---|---|---|
| CN | 1889415 | A | 1/2007 |
| CN | 101162959 | A | 4/2008 |
| CN | 100395961 | C | 6/2008 |

OTHER PUBLICATIONS

International Search Report dated Mar. 25, 2010, issued in corresponding International Application No. PCT/CN2009/073697.

*Primary Examiner* — Daniel Washburn
*Assistant Examiner* — Berhanu Tadese
(74) *Attorney, Agent, or Firm* — Scully, Scott, Murphy & Presser, P.C.

(57) ABSTRACT

The present invention discloses a method and apparatus for aligning the phases of a master clock and a slave clock; and the method comprises the following steps: A. locking a phase of a master clock; B. measuring phase difference between a slave clock and the master clock; and C. adjusting a phase output by the slave clock so as to align it with the phase of the master clock based on the phase difference measured in Step B. The present invention also discloses an apparatus for aligning the phases of a master clock and a slave clock. By measuring the phase difference between the master clock and the slave clock, and aligning the phases of the master clock and the slave clock according to the phase difference the present invention improves the precision of phase alignment without increasing costs.

6 Claims, 3 Drawing Sheets

(56) References Cited

U.S. PATENT DOCUMENTS

| | | | | |
|---|---|---|---|---|
| 8,335,240 | B2 * | 12/2012 | Boduch | 370/503 |
| 2004/0062278 | A1 * | 4/2004 | Hadzic et al. | 370/503 |
| 2004/0158759 | A1 * | 8/2004 | Chang et al. | 713/500 |
| 2008/0013662 | A1 * | 1/2008 | Sidiropoulos | 375/371 |
| 2008/0226004 | A1 * | 9/2008 | Oh | 375/358 |
| 2010/0150288 | A1 * | 6/2010 | Zhu et al. | 375/356 |

* cited by examiner

METHOD AND APPARATUS FOR ALIGNING PHASES OF A MASTER CLOCK AND A SLAVE CLOCK

FIELD OF THE INVENTION

The present invention relates to the digital communication field, and in particular to a method and apparatus for aligning phases of a master clock and a slave clock.

BACKGROUND OF THE INVENTION

In a synchronous digital communication network, since the clock is a very important constituent part, a working manner in which a master clock and a slave clock are equipped simultaneously in the design of communication equipment is adopted. That is, in a network element node, there are two clock units, and these two clock units can be master and slave interchangeably. Under normal circumstances, a master clock board provides timing synchronization signals for the communication equipment, and once the master clock board breaks down or is forced to switch by someone, a slave clock board immediately replaces the master clock board to provide the timing synchronization signals for the communication equipment. When the master clock and the slave clock are switching, it is required to ensure that services are not affected, for example, during the switching, service transient interruption, code errors, etc. should not be caused. Accordingly, in any cases, when the master clock and the slave clock are switching, it must be ensured that the master clock and the slave clock are consistent; otherwise the equipment will produce code errors and even service interruption.

As to how the master clock and the slave clock keep consistent, FIG. 1 is a schematic diagram of a structure of an apparatus for aligning the phases of the master clock and the slave clock in the existing art, and as shown in FIG. 1, a single clock chip is used to lock the slave clock to the master clock. However, after the locking of the master clock and the slave clock, although their frequencies are the same, there is still certain phase difference. When the phase difference between the master clock and the slave clock reaches to a certain extent, and when the master clock board and the slave clock board are switching, some abnormal conditions such as service transient interruption and code errors may occur. If we want to reduce the phase difference between the master clock and the slave clock, devices with more excellent performance are required, and thus the costs of the apparatus for achieving master and slave alignment is bound to increase.

SUMMARY OF THE INVENTION

The technical problems to be solved by the present invention are the problem that there is a phase difference between the master clock and the slave clock in the related art which may lead to service transient interruption and code error, and the problem of the increasing costs caused by the phase difference needing better devices. For this end, a solution for aligning phases of a master clock and a slave clock, which does not need to increase the costs and has relatively high phase alignment precision, is provided so as to solve at least one of the above problems.

The technical problems of the present invention are solved by the following technical solutions.

A method for aligning phases of a master clock and a slave clock comprises the following steps:

A: locking a phase of the master clock;

B: measuring phase difference between the slave clock and the master clock; and

C: adjusting, based on the phase difference measured in Step B, a phase outputted by the slave clock so as to align the phase outputted by the slave clock with the phase of the master clock.

In the Step B, a phase of the slave clock is shifted, and when the phase of the slave clock after the phase shift and the phase of the master clock are aligned, the shifted phase is outputted as the phase difference value.

The Step B comprises the following operations:

B1: shifting the phase of the slave clock with a predetermined step length along a predetermined direction;

B2: sampling the master clock by using the slave clock after the phase shift;

B3: judging, based on the sampling result of Step B2, whether the phase of the slave clock after the phase shift and the phase of the master clock are aligned, wherein if they have been aligned, Step B5 is performed; and if they are not aligned, Step B4 is performed;

B4: judging whether a threshold of the phase shift is reached, wherein if the threshold of the phase shift is not reached, Step B1 is performed; and if the phase difference is not obtained when the threshold of the phase shift is reached, the measurement is ended, and the Step C further comprises ending this operation when the phase difference is not obtained; and B5: calculating the phase difference between the master clock and the slave clock according to the number of the phase shifts of the slave clock.

In the Step B3, the step of judging whether the phase of the slave clock after the phase shift and the phase of the master clock are aligned, comprises the following operations: judging whether the sampling result is a rising edge of the master clock, wherein if the sampling result is the rising edge, it is judged that the phase of the slave clock after the phase shift and the phase of the master clock have been aligned, and otherwise, it is judged that the phase of the slave clock after the phase shift and the phase of the master clock are not aligned.

The step of judging whether the sampling result is the rising edge of the master clock comprises the following operations: when the phase of the clock shifts towards a forward direction, if a transition from a low level to a high level occurs in the sampling result, determining that it is the rising edge of the master clock; and when the phase of the clock shifts towards a reverse direction, if a transition from a high level to a low level occurs in the sampling result, determining that it is the rising edge of the master clock.

The sampling result of the Step B2 is stored in a shift register.

An apparatus for aligning the phases of a master clock and a slave clock comprises:

a clock chip module, configured to lock a phase of the master clock;

a phase difference measurement module, configured to measure phase difference between the master clock and the slave clock; and a control module, configured to adjust, based on the phase difference, a phase outputted by the slave clock so as to align the phase outputted by the slave clock with the phase of the master clock.

The phase difference measurement module comprises a phase-shift unit and a phase-shift control unit, wherein the phase-shift unit is configured to shift the phase of the slave clock, and the phase-shift control unit is configured to output the shifted phase as the phase difference when the phase of the slave clock after the phase shift and the phase of the master clock are aligned.

The phase difference measurement module further comprises a sampling unit; the phase-shift unit is also configured to shift the phase of the slave clock with a predetermine step length along a predetermined direction; the sampling unit is configured to sample the master clock by using the slave clock after the phase shift; the phase-shift control unit is also configured to judge whether the phase of the slave clock after the phase shift and the phase of the master clock are aligned based on the sampling result of the sampling unit, wherein if they have been aligned, calculate the phase difference between the master clock and slave clock according to the value of the phase shift of the slave clock, and if they are not aligned, judge whether a phase shift threshold is reached, and when the phase shift threshold is not reached, control the phase-shift unit to continue to shift the phase of the slave clock, and when the phase shift threshold is reached and a phase difference is not obtained, end the measurement; and the clock chip module is further configured to end the present operation when the phase difference is not obtained.

The phase difference measurement module is further configured to judge whether the sampling result is a rising edge of the master clock, wherein if it is the rising edge, it is determined that the phases have been aligned, and otherwise, it is determined that the phases are not aligned.

The beneficial effects of the present invention compared with the existing art are as follows:

(1) the present invention improves the precision of phase alignment without increasing the costs by measuring the phase difference of the master clock and the slave clock and aligning the phases of the master clock and the slave clock according to the phase difference; and (2) the present invention can perform high-precision measurement of the phase difference of the master clock and slave clock and directly output the phase difference without increasing the costs by shifting the phase of the slave clock, sampling the master clock and obtaining the phase difference according to the sampling result, so that a phase adjustment device can align the phases of the master clock and slave clock by one adjustment, which is simple and easy to implement.

DETAILED DESCRIPTION OF EMBODIMENTS

Functional Overview

Considering the problem existing in the related art that when the master clock board and slave clock board are switching, some abnormal situations such as service transient interruption and code errors may occur, which are caused by certain phase difference after the locking of the master clock and the slave clock although their frequencies are same, and the problem of increasing costs caused by needing better devices to solve the phase difference, the embodiments of the present invention provide a solution for aligning phases of the master clock and the slave clock, and the processing principle of the solution is as follows: Step A, locking the phase of the master clock; Step B, measuring the phase difference between the slave clock and the master clock; Step C, adjusting, based on the phase difference measured in Step B, the phase outputted by the slave clock to align it with the phase of the master clock.

What needs to explain is that the embodiments of the present application and the features of the embodiments can be combined with each other if there is no conflict. The present invention is described in detail hereinafter with reference to the accompanying drawings in combination with the embodiments.

In the following embodiments, the steps shown in the flowcharts of the accompanying drawings can be executed in a computer system such as a set of computer executable instructions; and, although a logical sequence is shown in the flowcharts, in some cases, the shown or described steps can be executed in a sequence different from the sequence herein.

The embodiments of the present invention will be described in detail by particular embodiments in conjunction with the drawings hereinafter.

Figure 1:
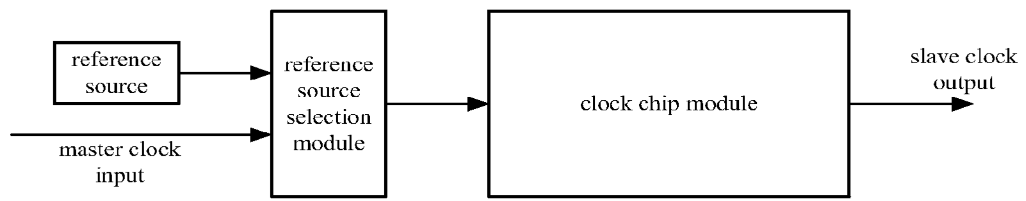
FIG. 1 is a schematic diagram of a structure of an apparatus for aligning phases of a master clock and a slave clock in the existing art.
Figure 2:
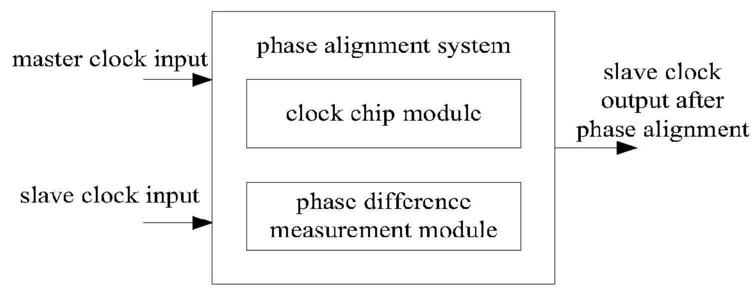
FIG. 2 is a schematic diagram of a structure of a particular embodiment of an apparatus according to the embodiments of the present invention.
Figure 3:
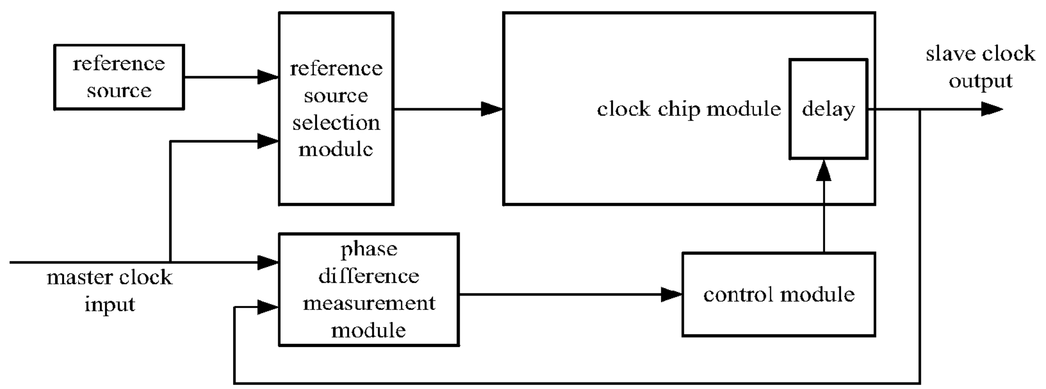
FIG. 3 is a schematic diagram of a structure of another particular embodiment of the apparatus according to the embodiments of the present invention.
Figure 4:
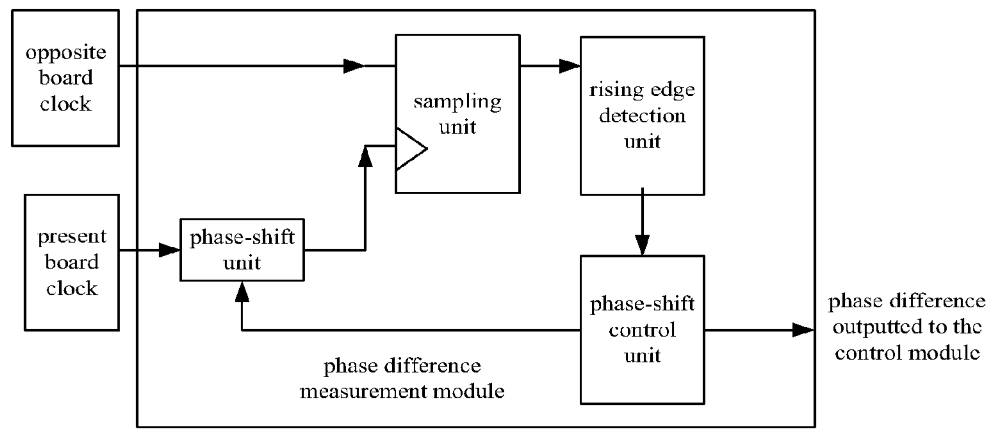
FIG. 4 is a schematic diagram of a structure of a phase difference measurement module of a particular embodiment of the apparatus according to the embodiments of the present invention.

An apparatus for realizing the consistency of a master clock and a slave clock is provided according to the embodiments of the present invention, and an embodiment thereof is as shown in FIG. 2. FIG. 2 is a schematic diagram of the structure of a particular embodiment of the apparatus according to the embodiments of the present invention. And as shown in FIG. 2, a phase alignment system is used for aligning the phases of the master clock and the slave clock in this apparatus, and specifically, the phase alignment system comprises a clock chip module and a phase difference measurement module. FIG. 3 is a schematic diagram of the structure of another particular embodiment of the apparatus according to the embodiments of the present invention, and as shown in FIG. 3, the apparatus comprises a reference source selection module, a clock chip module, a phase difference measurement module and a control module. FIG. 4 is a schematic diagram of the structure of the phase difference measurement module of the particular embodiment of the apparatus according to the embodiments of the present invention, and as shown in FIG. 4, the phase difference measurement module comprises: a phase-shift unit, a phase-shift control unit, a sampling unit and a rising edge detection unit. The modules in FIGS. 2 to 4 will be described in detail hereinafter.

The reference source selection module is configured to select reference source clock input, which can be achieved by a programmable logic device. The clock chip module comprises a delay unit. The clock chip module is configured to lock the frequency and phase of the master clock, and can be implemented by a synchronous digital hierarchy (SDH) dedicated clock chip plus an analogue loop debounce circuit. By changing the value of the phase register in the clock chip module, and by the delay unit adjusting the phase of the output clock, the output phase can be directly adjusted without changing the output frequency. The phase difference measurement module is configured to measure the phase difference between the slave clock and the master clock, and in another embodiment, the phase difference measurement module can be a field programmable gate array (FPGA) chip. The control module is configured to control the delay unit of the clock chip module according to the phase difference and adjust the output phase of the slave clock to align it with the phase of the master clock. The control module may be a central processing unit (CPU) chip.

The phase difference measurement module may also comprise a phase-shift unit configured to shift the phase of the slave clock. And in an embodiment, the phase-shift unit can be a delay locked loop (DLL) module in the FPGA chip, which can achieve high-precision measurement of the phase difference between the master clock and the slave clock, thereby improving the precision of aligning the master clock and the slave clock. The phase difference measurement module is also configured to output the shifted phase as the phase difference when the phase of the slave clock after the phase shift and that of the master clock are aligned. The shifted phase can be calculated according to the number of the phase shifts.

The phase-shift unit is also configured to shift the phase of the slave clock with a predetermined step length along a predetermined direction, wherein the predetermined step length may be 0.05 ns or other appropriate step lengths, and the predetermined direction may be set as a forward direction or a reverse direction as required. The phase difference measurement module also comprises a sampling unit, configured to sample the master clock by using the slave clock after the phase shift. The phase measurement module may also comprise a phase-shift control unit. The phase-shift control unit is configured to judge, based on the sampling result from the sampling unit, whether the phase of the slave clock after the phase shift and that of the master clock are aligned. If the phases have been aligned, the phase difference between the master clock and the slave clock is calculated according to the value of the shifted phase of the slave clock, and if the phases are not aligned, it is judged whether a phase shift threshold is reached. If the phase shift threshold is not reached, the phase-shift unit is controlled to continue to shift the phase of the slave clock; and if the phase shift threshold is reached, and the phase difference is not obtained, the measurement is ended. The Phase-shift control module is also configured to end the present operation when the phase difference is not obtained. The sampling result of the sampling unit can be stored in a shift register.

The phase difference measurement module is also configured to judge whether the sampling result is a rising edge of the master clock, wherein if it is the rising edge, it is determined that the phases have been aligned, and otherwise, it is determined that the phases are not aligned. In one embodiment, a rising edge detection unit may be used to judge whether the sampling result is the rising edge of the master clock.

The phase difference measurement module may also be configured to determine that the sampling result is a rising edge of the master clock when the phase of the clock is shifted towards the forward direction and there is a transition from a low level to a high level in the sampling result, and determine that the sampling result is a rising edge of the master clock when the phase of the clock is shifted towards the reverse direction and there is a transition from a high level to a low level in the sampling result.

In one embodiment of the embodiments of the present invention, the master clock and slave clock system comprises a master clock board and a slave clock board. Each clock board comprises an apparatus for aligning the phases of the master clock and the slave clock. The output of the master clock and the output of the slave clock are simultaneously inputted into other single boards (such as a main control board, an optical interface board, a service board and an office board) in the system respectively.

The method for aligning phases of a master clock and a slave clock in the embodiments of the present invention comprises the following steps:

Step A: locking the phase of a master clock;

Step B: measuring phase difference between a slave clock and the master clock; and Step C: adjusting, based on the phase difference measured in Step B, the phase outputted by the slave clock, so as to align it with the phase of the master clock.

In the Step B, the phase of the slave clock is shifted. When the phase of the slave clock after the phase shift and the phase of the master clock are aligned, the shifted phase is outputted as the phase difference.

Step B performs the following:

B1: shifting the phase of the slave clock with a predetermined step length along a predetermined direction;

B2: sampling the master clock by using the slave clock after the phase shift;

B3: judging whether the phase of the slave clock after the phase shift and that of the master clock are aligned based on the sampling result in Step B2, wherein if they have been aligned, Step B5 is performed; and if they are not aligned, Step B4 is executed;

B4: judging whether a phase shift threshold is reached, wherein if the phase shift threshold is not reached, Step B1 is performed; and if the phase shift threshold is reached and the phase difference is not obtained, the measurement is ended, and the Step C also comprises ending this operation when the phase difference is not obtained; and B5: calculating the phase difference between the master clock and the slave clock according to the number of the phase shifts of the slave clock.

The step of judging whether the phase of the slave clock after the phase shift and that of the master clock are aligned in Step B3 performs the following: judging whether the sampling result is a rising edge of the master clock, wherein if it is the rising edge, it is determined that the phase of the slave clock after the phase shift and that of the master clock have been aligned, and otherwise, it is determined that they are not aligned.

The step of judging whether the sampling result is the rising edge of the master clock performs the following: when the phase of the clock is shifted towards the forward direction, if transition from a low level to a high level occurs in the sampling result, it is determined that it is a rising edge of the master clock; and when the phase of the clock shifts towards reverse direction, if transition from a high level to a low level occurs in the sampling result, it is determined that it is a rising edge of the master clock.

Figure 5:
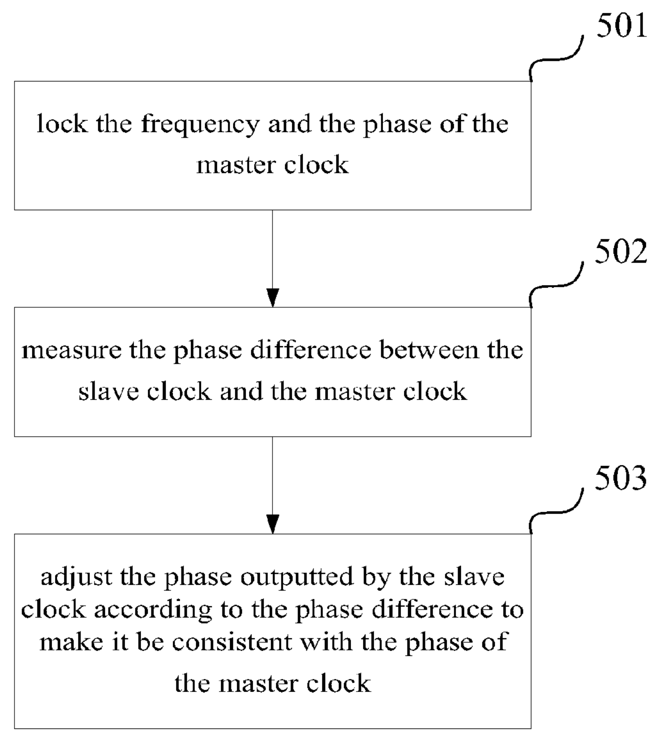
FIG. 5 is a flowchart of aligning the phases of a particular embodiment of a method according to the embodiments of the present invention.

Another embodiment of the embodiments of the present invention in the following is to align the phases of the master clock and the slave clock based on the apparatus of the present invention. FIG. 5 is a flowchart of the phase alignment method of a particular embodiment of the method according to the embodiments of the present invention; and the process thereof is as shown in FIG. 5 and comprises the following steps.

Step 501: lock the frequency and phase of the master clock; the clock chip module performs a preliminary adjustment to the output clock of the clock board to enable the frequencies and phases of the master clock and the slave clock to be consistent after the locking, wherein the clock chip can be implemented by an SDH dedicated clock chip plus an analogue loop debounce circuit.

Step 502: measure the phase difference between the slave clock and the master clock; input the slave clock outputted by the slave clock board and the master clock outputted by the master clock board into the phase difference measurement module, and the phase difference value module measures the phase difference between the master clock and the slave clock. The precision of the measured phase difference depends on the minimum phase shift step length of the phase-shift unit in the phase difference measurement module, and the maximum value of the measured phase difference depends on the maximum amplitude of the phase shift. In this specific embodiment, the adjustment precision can be up to 0.05 ns, the adjustment range can be up to 10 ns, and the phase difference measurement module can be an FPGA chip.

Step 503: adjust the phase outputted by the slave clock according to the phase difference to align the outputted phase of the slave clock with the phase of the master clock. The control module adjusts the phase adjustment register in the clock chip module according to the phase difference measured by the phase difference measurement module, and the clock chip module adjusts the clock output of the slave clock board by using the delay unit according to the phase adjustment register so as to align the phase of the slave clock outputted by the slave clock board and that of the master clock, without adjusting the master clock board.

Figure 6:
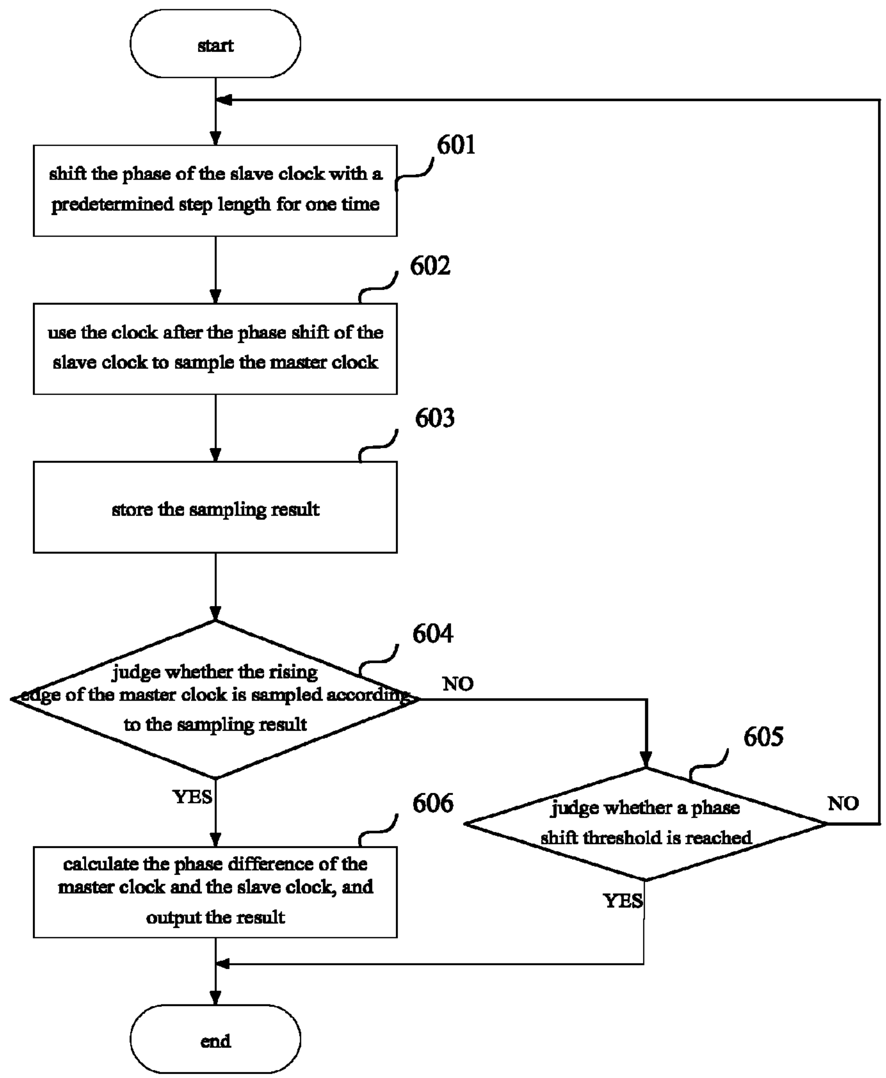
FIG. 6 is a flowchart of measuring the phase difference of the particular embodiment of the method according to the embodiments of the present invention.

FIG. 6 is a flowchart of measuring the phase difference according to a particular embodiment of the method of the embodiments of the present invention, and the measurement process of Step 502 is as shown in FIG. 6 and comprises the following steps 601 to 606.

Step 601: the phase of the slave clock is shifted once by a predetermined step length along a predetermined direction, wherein the predetermined step length may be 0.05 ns, and the predetermined direction may be the forward direction or the reverse direction.

Step 602: the master clock is sampled by using the slave clock after the phase shift.

Step 603: the sampling result is stored; and the sampling result may be stored in a shift register.

Step 604: it is judged whether the sampling result is a rising edge of the master clock according to the sampling result, wherein if it is the rising edge, step 606 is performed, and otherwise, Step 605 is executed.

Step 605: it is judged whether a phase shift threshold is reached, wherein if it is determined to be "YES", the phase difference measurement is ended, and if it is determined to be "no", Step 601 is directly returned to and the phase difference measurement cycle continues. When the threshold is reached, it has been unable to measure the phase difference, the measurement is ended, and if the threshold is not reached, Step 601 is performed and the phase is shifted with the predetermined step length along the predetermined direction for another time. In this particular embodiment, the threshold value of the phase shift can be set as 10 ns.

Step 606: the phase difference of the master clock and the slave clock is calculated, and the result is outputted. The phase difference of the master clock and the slave clock is calculated according to the number of the phase shifts, and the phase difference is outputted to the control unit. Then the phase difference measurement is ended.

In summary, by the phase alignment of the master clock and the slave clock, the method for aligning the phases of the master clock and the slave clock of the embodiments of the present invention not only ensures that the frequencies and phases finally outputted by the master clock and the slave clock are consistent, but also improves the precision of phase alignment of the master clock and the slave clock to be within 1 ns, which ensures that there is no phase transition phenomena during switching of the master clock and the slave clock and provides a continuous and stable signal output to each single board; thus each single board will not produce code errors due to the switching of the master clock and the slave clock.

Obviously, those skilled in the art shall understand that individual modules and individual steps of the present invention can be implemented with general computing devices, they may be integrated in a single computing device or distributed in network formed by a plurality of computing devices, optionally, they may be implemented by using program codes executable by computing devices, thus they may be stored in memory devices for execution by the computing devices, or implemented by making them into integrated circuit module respectively, or by making several means or steps in to a single IC. Thus, the present invention is not limited to any particular combination of hardware and software.

The above contents is the further detailed description to the present invention by combining with the specific preferred embodiment of the present invention, and it can not affirmed that the particular implement of the present invention is only limited to these descriptions. For those ordinary skilled in the art that the present invention belongs to, a number of simple deductions or replaces can be made without deviating from the concept of the present invention and should be regarded as belonging to the protection scope of the present invention.

What is claimed is:

1. A method for aligning the phases of a master clock and a slave clock, comprising the following steps:

A: locking a phase of the master clock;

B: measuring phase difference between the slave clock and the master clock; and

C: adjusting, based on the phase difference measured in Step B, a phase outputted by the slave clock so as to align the phase outputted by the slave clock with the phase of the master clock, wherein in the Step B, a phase of the slave clock is shifted, and when the phase of the slave clock after the phase shift and the phase of the master clock are aligned, the shifted phase is outputted as the phase difference value, wherein the Step B comprises the following operations:

B1: shifting the phase of the slave clock with a predetermined step length along a predetermined direction;

B2: sampling the master clock by using the slave clock after the phase shift;

B3: judging, based on the sampling result of Step B2 whether the phase of the slave clock after the phase shift and the phase of the master clock are aligned, wherein if the phase of the slave clock and the phase of the master clock have been aligned, Step B5 is performed and if the phase of the slave clock and the phase of the master clock have not been aligned, Step B4 is performed;

B4: judging whether a threshold of the phase shift is reached, wherein if the threshold of the phase shift is not reached, Step B1 is performed; and if the phase difference is not obtained when the threshold of the phase shift is reached, the measurement is ended, and the Step C further comprises ending this operation when the phase difference is not obtained; and B5: calculating the phase difference between the master clock and the slave clock according to the number of the phase shifts of the slave clock.

2. The method according to claim 1, wherein in the Step B3, the step of judging whether the phase of the slave clock after the phase shift and the phase of the master clock are aligned, comprises the following operations: judging whether the sampling result is a rising edge of the master clock, wherein if the sampling result is the rising edge, it is judged that the phase of the slave clock after the phase shift and the phase of the master clock have been aligned, and otherwise, it is judged that the phase of the slave clock after the phase shift and the phase of the master clock are not aligned.

3. The method according to claim 2, wherein the step of judging whether the sampling result is the rising edge of the master clock comprises the following operations: when the phase of the clock shifts towards a forward direction, if a transition from a low level to a high level occurs in the sampling result, determining that it is the rising edge of the master clock; and when the phase of the clock shifts towards a reverse direction, if a transition from a high level to a low level occurs in the sampling result, determining that it is the rising edge of the master clock.

4. The method according to claim 1, wherein the sampling result of the Step B2 is stored in a shift register.

5. An apparatus for aligning the phases of a master clock and a slave clock, comprising:

a clock chip module, configured to lock a phase of the master clock;

a phase difference measurement module, configured to measure phase difference between the master clock and the slave clock; and a control module, configured to adjust, based on the phase difference, a phase outputted by the slave clock so as to align the phase outputted by the slave clock with the phase of the master clock, wherein the phase difference measurement module comprises a phase-shift unit and a phase-shift control unit, wherein the phase-shift unit is configured to shift the phase of the slave clock, and the phase-shift control unit is configured to output the shifted phase as the phase difference when the phase of the slave clock after the phase shift and the phase of the master clock are aligned, wherein, the phase difference measurement module further comprises a sampling unit; the phase-shift unit is further configured to shift the phase of the slave clock with a predetermined step length along a predetermined direction;

the sampling unit is configured to sample the master clock by using the slave clock after the phase shift;

the phase-shift control unit is further configured to judge whether the phase of the slave clock after the phase shift and the phase of the master clock are aligned based on the sampling result of the sampling unit, wherein if the phase of the slave clock and the phase of the master clock have been aligned, calculate the phase difference between the master clock and slave clock according to the value of the phase shift of the slave clock, and if the phase of the slave clock and the phase of the master clock have not been aligned, judge whether a phase shift threshold is reached, and when the phase shift threshold is not reached, control the phase-shift unit to continue to shift the phase of the slave clock, and when the phase shift threshold is reached and a phase difference is not obtained, end the measurement; and the clock chip module is further configured to end the present operation when the phase difference is not obtained.

6. The apparatus according to claim 5, wherein the phase difference measurement module is further configured to judge whether the sampling result is a rising edge of the master clock, wherein if it is the rising edge, it is determined that the phases have been aligned, and otherwise, it is determined that the phases are not aligned.

* * * * *